(12) United States Patent
Lee et al.

(10) Patent No.: US 6,410,430 B1
(45) Date of Patent: Jun. 25, 2002

(54) ENHANCED ULTRA-SHALLOW JUNCTIONS IN CMOS USING HIGH TEMPERATURE SILICIDE PROCESS

(75) Inventors: Kam Leung Lee, Putnam Valley; Ronnen Andrew Roy, Ossining, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/614,597

(22) Filed: Jul. 12, 2000

(51) Int. Cl.⁷ .............................................. H01L 21/44
(52) U.S. Cl. ...................... 438/664; 438/683; 438/533
(58) Field of Search ................................ 438/664, 683, 438/514, 533

(56) References Cited

U.S. PATENT DOCUMENTS

| | | | |
|---|---|---|---|
| 5,236,865 A | * | 8/1993 | Sandhu et al. |
| 5,567,651 A | * | 10/1996 | Berti et al. |
| 5,620,926 A | * | 4/1997 | Itoh |
| 6,051,283 A | * | 4/2000 | Lee et al. |
| 6,156,654 A | * | 12/2000 | Ho et al. |
| 6,214,682 B1 | * | 4/2001 | Wang |
| 6,242,348 B1 | * | 6/2001 | Kamal et al. |
| 6,251,757 B1 | * | 6/2001 | Yu |

OTHER PUBLICATIONS

Stanley Wolf and Richard N. Tauber, "Silicon Processing for the VLSI Era—vol. 1: Process Technology," Lattice Press, Sunset Beach, California (1986), pp. 285–292.*
Stanley Wolf and Richard N. Tauber, "Silicon Processing for the VLSI Era—vol. 1: Process Technology," Lattice Press, Sunset Beach, California (1986), pp. 388–392.*

* cited by examiner

Primary Examiner—John F. Niebling
Assistant Examiner—Stephen W. Smoot
(74) Attorney, Agent, or Firm—Scully, Scott, Murphy & Presser; Casey P. August

(57) ABSTRACT

A process of fabricating a CMOS device having an enhanced ultra-shallow junction in which substantially no transient enhanced diffusion of dopant occurs is provided. Specifically, the CMOS device having the aforementioned properties is formed by implanting a dopant into a surface of a Si-containing substrate so as to form a doped region therein; forming a metal layer on the Si-containing substrate; and heating the metal layer so as to convert the metal layer into a metal silicide layer while simultaneously activating the doped region, whereby vacancies created by this heating step combine with interstitials created in step (a) so as to substantially eliminate any transient diffusion of the dopant in said Si-containing substrate.

28 Claims, 1 Drawing Sheet

ENHANCED ULTRA-SHALLOW JUNCTIONS IN CMOS USING HIGH TEMPERATURE SILICIDE PROCESS

FIELD OF THE INVENTION

The present invention relates to complementary metal oxide semiconductor (CMOS) device manufacturing, and in particular to a method of fabricating an ultra-shallow junction in a CMOS device in which the transient enhanced diffusion (TED) of boron and other like dopants is substantially eliminated.

BACKGROUND OF THE INVENTION

Advances in the miniaturization of CMOS devices have been a key driving force behind the explosive growth of various network centric computing products such as ASIC high-speed microprocessors and memories, low power hand-held computing devices and advanced multi-media audio and video devices. Smaller CMOS devices typically equate to faster switching times which in turn lead to faster and better performing end user systems.

The process of miniaturizing CMOS devices involves scaling down various horizontal and vertical dimensions in the CMOS device. In particular, the thickness of the ion implanted source/drain junction of a p or n-type transistor is scaled down with a corresponding scaled increase in substrate channel doping. In this manner, a constant electric field is maintained in the transistor channel which results in higher speed performance for scaled down CMOS transistors. For example, for a 0.1 $\mu$m CMOS device, the source/drain extension junction closest to the transistor channel is as shallow as 30 nm and has a channel doping as high as $1 \times 10^{18}$ atoms/cm$^3$.

The formation of source/drain extension junctions in CMOS devices is typically carried out in the prior art by ion implantation in appropriately masked source/drain regions of a Si substrate with boron (p-type) or arsenic and phosphorus (n-type) dopants. Although ion implantation is used in creating the source/drain regions, ion implantation causes crystal damage to the Si substrate as well as the formation of excess Si interstitials.

As is known to those skilled in the art, Si interstitials are displaced Si atoms created by ion bombardment of the crystalline Si substrate. During subsequent thermal annealing, the presence of excess Si interstitials greatly enhances (10 to 1000 times) the normal diffusion of dopants through the Si substrate and results in a much deeper source/drain junction and a poorer junction profile.

This greatly enhanced diffusion of dopants due to the presence of excess Si interstitials around the dopant atoms is commonly referred to in the prior art as transient enhanced diffusion (TED). In particular, the relatively high diffusivity of small boron dopants in combination with ion channeling and transient diffusion makes the fabrication of small p-type CMOS devices difficult. The aforementioned combination also represents a major hurdle that needs to be overcome further miniaturization of the CMOS device technology can occur.

Several prior art approaches have attempted to reduce the transient enhanced diffusion for shallow junction formation. In one approach, a carbon co-implant was used to reduce the transient diffusion of boron dopant during rapid thermal annealing (RTA). The conditions employed in forming the shallow junction using carbon co-implantation were as follows: 2 keV boron shallow implant, dose $1 \times 10^{15}$/cm$^2$, carbon implant (energy not reported), carbon dose $2 \times 10^{14}$/cm$^2$. Rapid thermal anneal (RTA) conditions were 950° C., 30 seconds, or 1050° C., 30 seconds, respectively.

Although carbon co-implant is effective in reducing the transient diffusion of boron, this method suffers from the disadvantage that a high density of residual defects remain after RTA. This is the case even using high temperature anneal conditions (1050° C., 30 seconds). The high density of residual defects results in high electrical leakages for the shallow junction.

Another approach reported by T. H. Huang, et al. ("Influence of Fluorine Preamorphization on the Diffusion and Activation of Low-energy Implanted Boron during Rapid Thermal Anneal," Appl. Phys. Lett., (1994) Vol. 65, No. 14, p. 1829) used fluorine co-implants to reduce the transient diffusion of boron dopants during rapid thermal anneals. The conditions used in this reference for shallow junction formation are as follows: fluorine implant, 40 keV ion energy, dose $= 2 \times 10^{-5}$/cm$^2$, 5 keV boron or 23 keV BF$_2$ shallow implants. In the process disclosed by Huang, et al., the wafers were rapid thermal annealed at 1000° C., 1050° C. and 1100° C. for 30 seconds. Although the presence of fluorine implants reduced the transient boron enhanced diffusion during RTA, this prior art method also suffers from the disadvantage that residual defects remain after 1000° C., 30 seconds anneal. Residual defects can only be removed with 1100° C., 30 seconds anneal. However, substantial dopant motion occurs at this higher temperature and therefor ultra-shallow junctions cannot be formed.

Another approach reported by S. Saito entitled "Defect Reduction by MeV Ion Implantation for Shallow Junction Formation," Appl. Phys. Lett., (1993) Vol. 63, No. 2, p. 197 used fluorine implants for preamphorization (40 keV, $1 \times 10^{15}$/cm$^2$), shallow implant; boron at 10 keV and $5 \times 10^{15}$/cm$^2$. This was followed by ion implantation of either fluorine or silicon at 1 MeV energy or arsenic at 2 MeV energy. The dose used for the MeV implant was between $5 \times 10^{14}$ to $5 \times 10^{15}$/cm$^2$. The samples were rapid thermal annealed at 1000° C. or 1100° C. for 110 seconds.

Under these experimental conditions, Saito demonstrated that the MeV implants were effective in reducing the boron transient diffusion with and without fluorine preamphorization. This reference also demonstrated that maximum reduction in boron dopant diffusion was achieved when both fluorine preamorphization and MeV fluorine implants were used. However, as mentioned in the prior art earlier, use of fluorine implants creates residual defects and requires temperatures as high as 1100° C. for low leakage junctions to be formed.

In each of the prior art references mentioned hereinabove, high energies were used to implant boron (2 to 10 keV) or BF$_2$ (23 keV) into semiconductor materials. These energy ranges are however unsuitable to create an ultra-shallow boron dopant junction below 50 nm. All the junction depths created by the prior art techniques are between 60–100 nm. Although the combination of high temperature (>1000° C.) and long annealing times (10 to 30 seconds) minimizes residue defects due to carbon or fluorine co-implants, it inhibits the formation of ultra-shallow junctions.

Despite the current advances made in the field of microelectronics, there is still a need for providing a new and improved method which provides an ultra-shallow junction in CMOS devices while overcoming all of the drawbacks mentioned hereinabove.

SUMMARY OF THE INVENTION

One object of the present invention is to provide a method of fabricating ultra-shallow junctions in microelectronic devices. The term "ultra-shallow" as used herein denotes a junction whose depth is less than 50 nm from a top surface of a semiconductor substrate. More preferably, the present invention forms junctions having a depth of from about 10 to about 40 nm.

Another object of the present invention is to provide a method of forming ultra-shallow junctions wherein the transient enhanced diffusion (TED) of boron and other like dopants is substantially eliminated.

A further object of the present invention is to provide a method of fabricating ultra-shallow junctions wherein the depth of the junction is not effected by a subsequent high temperature annealing (i.e., activation annealing or silicide) step.

These as well as other objects and advantages can be achieved in the present invention by introducing a material into the CMOS structure that produces excess vacancies in the substrate which can combine with and substantially annihilate the interstitials during a subsequent heating step before they can cause excess dopant diffusion.

Specifically, the method of the present invention, which achieves all of the above mentioned objects and advantages, comprises the steps of:

(a) implanting a dopant into a surface of a Si-containing substrate so as to form a doped region therein;

(b) forming a metal layer on said Si-containing substrate; and (c) heating said metal layer so as to convert said metal layer into a metal silicide layer while simultaneously activating said doped region, whereby vacancies created by said heating combine with interstitials created in step (a) so as to substantially eliminate any transient diffusion of said dopant in said Si-containing substrate.

In one embodiment of the present invention, the metal layer is formed in close proximity to the doped region provided in step (a). In another more highly preferred embodiment, the metal layer is formed over at least a portion of the doped region provided in step (a).

The above processing steps lead to the formation of ultra-shallow junctions in the Si-containing substrate since the transient enhanced diffusion of dopants like boron are substantially eliminated.

DETAILED DESCRIPTION OF THE INVENTION

Figure 1:
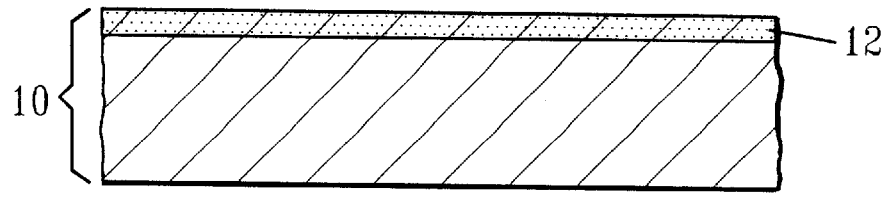
FIGS. 1–4 are cross-sectional views depicting the basic processing steps of the present invention used in forming ultra-shallow junctions.

The present invention which provides a method of fabricating ultra-shallow junctions in a CMOS device while substantially preventing transient enhanced diffusion of dopants such as boron will now be described in more detail by referring to the drawings that accompany the present application. It should be noted that in the accompanying drawings like reference numerals are used for describing like and/or corresponding elements.

Reference is made to FIGS. 1–4 which illustrate the basic processing steps of the present invention which are employed in forming a CMOS device having ultra-shallow junctions therein. FIG. 1 shows a cross-sectional view of a portion of a structure after conducting step (a) of the present invention, i.e., after implanting a dopant into the substrate.

Specifically, FIG. 1 comprising Si-containing substrate 10 that has doped region 12 formed therein. Although only one doped region is shown in the drawings, the present invention works for structures that include a plurality of doped regions therein.

The structure shown in FIG. 1 is composed of conventional materials that are well known in the art and is made using conventional processes that are also well known to those skilled in the art. For example, Si-containing substrate 10 is comprised of any Si-containing semiconductor material such as Si, SiGe, Si/SiGe, Si\SiO$_2$\Si and other like Si-containing semiconductor materials. The substrate may contain various isolation regions such as STI and LOCOS either in the substrate or on a surface thereof. Additionally, the substrate may contain various active device regions that are formed utilizing conventional processing techniques well known to those skilled in the art. For clarity the isolation and/or active device regions are not shown in the portion of the drawings illustrated herein.

Doped region 12 is formed in the substrate by implanting an n or p-type dopant into the substrate. Illustrative examples of n-type dopants that can be employed in the present invention include, but are not limited to: As or P. Illustrative examples of p-type dopants include, but are not limited to: B or In. Of the various dopants mentioned above, it is preferred that B be used as the dopant. The source of the dopant ion is usually in the form of a molecular complex ion derived from $BF_2$, $B_{10}H_{14}$ or $As_2$ gas sources.

The dopant ion implantation step is conducted using an ion implantation apparatus that operates at energies of from about 0.3 to about 50 KV. More preferably, the dopant ion implantation step is carried out at an energy range of from about 0.5 to about 20 KV.

The dosage of dopant ions implanted in this step of the present invention is in the range of from about $1\times10^{14}/cm^2$ to about $1\times10^{16}/cm^2$, more preferably a dosage of from about $3\times10^{14}/cm^2$ to about $5\times10^{15}/cm^2$ is employed in the present invention. It should be noted that prior to conducting the above defined dopant ion implantation step, the substrate may be implanted with heavy ions such as Si or Ge and then preamorphized using conventional processing techniques well known to those skilled in the art.

Using the above defined parameters, the dopant ion is implanted to a depth of from about 50 to about 1000 Å. More preferably, in this step of the present invention, the dopant ion is implanted to a depth of from about 100 to about 400 Å.

Figure 2:
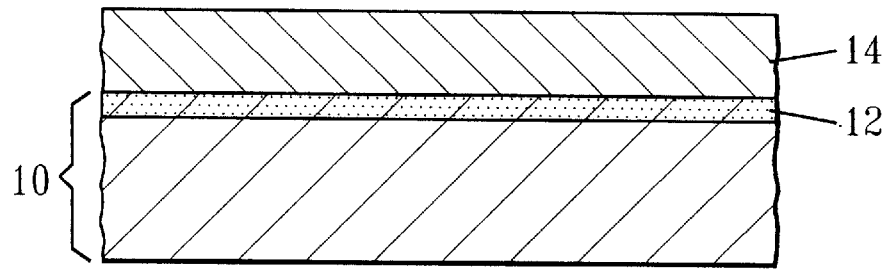

FIG. 2 illustrates the structure that is formed after conducting step (b) of the present invention, i.e., after forming a metal layer on the surface of the structure. In one highly preferred embodiment of the present invention, metal layer 14 is formed on the substrate so as to at least cover portions of the substrate which include the previously doped region. Alternatively, the metal layer is formed on portions of the Si-containing substrate that is in close proximity to the doped region.

Metal layer 14 is composed of any reactive metal or reactive metal alloy in which a silicide layer can be formed therefrom. Illustrative examples of reactive metals that can be employed in the present invention include, but are not limited to: Ni, Ti, W, Co and other metals that are capable of forming a silicide upon conducting a silicide process. Of the various metals listed above, it is preferred in the present invention that metal layer 14 be composed of Co. When in alloy form, any conventional alloying element including, but not limited to: Si, Ge, Fe, Mo, Cr and Nb can be employed in the present invention.

The metal layer is formed on the substrate utilizing a conventional deposition process well known to those skilled in the art. Suitable deposition processes that can be used in forming metal layer 14 include, but are not limited to: chemical vapor deposition (CVD), plasma-assisted CVD, plating, sputtering, evaporation, chemical deposition and other like deposition processes that are capable of forming a metal layer on the surface of a substrate.

The deposition of the metal onto the substrate should be conducted at temperatures that is low enough to avoid activation of the doped regions previously formed therein. Specifically, the deposition process used in forming the metal layer on the substrate is carried out at a temperature of about 350° C. or below, with a deposition temperature of 100° C. or below being more highly preferred.

The thickness of the reactive metal layer formed on the surface of the structure is not critical to the present invention and it will vary depending upon the deposition process used in forming the same. Typically, however, the metal layer has a thickness of from about 5 0to about 40 nm.

In one embodiment of the present invention which is not illustrated in the drawings, the reactive metal layer may be capped by an inert layer such as TiN, Ti or TaN having a thickness of from about 10 to about 40 nm.

Figure 3:
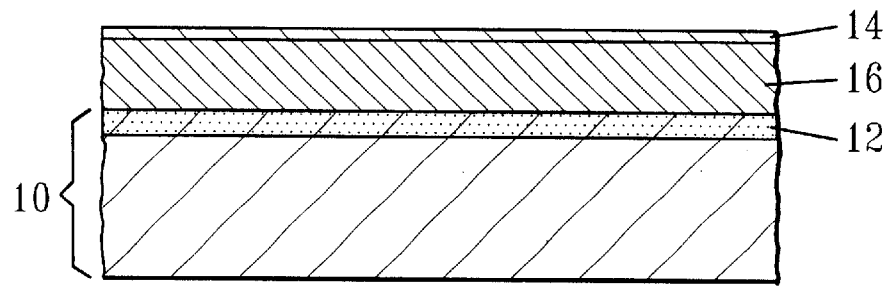

Next, as shown in FIG. 3, the structure of FIG. 2 is subjected to a heating step that is capable of converting metal layer 14 into metal silicide layer 16 while simultaneously activating the doped region, whereby vacancies created in the heating step combine with interstitials created during dopant ion implantation so as to substantially eliminate any transient diffusion of the dopant in the Si-containing substrate.

The heating step employed in the present invention which serves to form the silicide layer and to activate the dopant is a rapid thermal annealing (RTA) process which is carried out in an inert ambient at a temperature of about 850° C. or above for a time period of about 60 seconds or less. More specifically, the RTA process employed in the present invention is carried out at a temperature of from about 900° to about 1050° C. for a time period of from about 1 to about 10 seconds. The RTA process may be carried out using a single temperature or various ramp and soak cycles may also be employed.

As stated above, the RTA process of the present invention is carried out in an inert ambient. Suitable inert ambients that can be employed in the present invention include, but are not limited to: He, Ar, $N_2$ and mixtures thereof. The inert ambient may also be mixed with less than 10% of another gas such as $H_2$.

The RTA process may be carried out utilizing a conventional reactor chamber, or alternatively, the RTA process is carried out using a microwave annealing process wherein microwaves having an energy on the order of 1–10 KW/cm² or above are used to cause localized heating of the structure. Heating may also be carried out using a laser annealing process (pulse or continuous) in which the energy of the laser is capable of causing the formation of the silicide layer in the structure as well as activating the doped regions.

The combined silicide and activating annealing process of the present invention allows for vacancy injections into the structure which counter the interstitials produced during the previous implant step. This injection, in turn, minimizes the transient enhanced diffusion of dopants in the structure. Moreover, the fact that the silicidation occurs at very high temperatures also means that the vacancies will be very mobile in the substrate. The increased mobility also ensures that the TED will be reduced. This also ensures that regions of layer 12 not directly under layer 14, but in close proximity, will also experience less TED.

In some instances, as shown in FIG. 3, the heating step does not convert all the metal layer into a silicide layer. When this occurs, the remaining metal layer that was not previously silicided can be removed from the structure providing the structure shown in FIG. 4. During this step of the present invention, the optional capping layer may also be removed.

Specifically, any remaining metal layer that has not been converted into a metal silicide layer may be removed from the structure utilizing a conventional wet chemical etch process wherein the chemical etchant employed is highly selective in removing metal as compared to silicide. Suitable chemical etchants that may be used in the present invention for this purpose include $H_2O_2/H_2SO_4$ based chemistry. It is also possible to remove the remaining metal layer by utilizing a conventional dry etching technique such as reactive-ion etching, ion-beam etching and plasma etching.

In an optional embodiment of the present invention, a second RTA process may follow the RTA process mentioned above. When a second RTA process is carried out, the same or different conditions as mentioned above may be employed. The second anneal is used in some instances to ensure that the doped regions have been completely activated.

Figure 4:
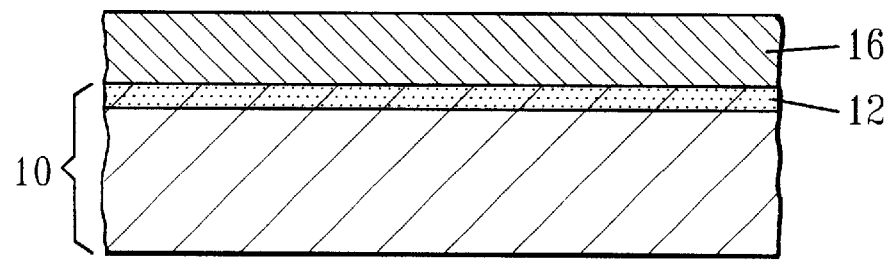

The structure shown in FIG. 4, which includes an ultrashallow junction (represent by doped region 12), may then be subjected to other conventional CMOS device processing schemes in which various devices such as transistors, capacitors, BiCMOS are formed on the structure. Since the other CMOS device processing schemes are well known in the art, a description of the same is not provided herein.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating an ultra-shallow junction in a substrate of a CMOS device comprising the steps of:
   (a) implanting a dopant into a surface of a Si-containing substrate to form a doped region therein;
   (b) forming a metal layer on said Si-containing substrate at a temperature of about 350° C. or below; and
   (c) heating said metal layer to convert said metal layer into a metal silicide layer while simultaneously activating said doped region, whereby vacancies created by said heating combine with interstitials created in step (a) to substantially eliminate any transient diffusion of said dopant in said Si-containing substrate.

2. The method of claim 1 wherein said dopant is a p-type dopant.

3. The method of claim 2 wherein said p-type dopant is B.

4. The method of claim 1 wherein said dopant is an n-type dopant.

5. The method of claim 4 wherein said n-type dopant is As or P.

6. The method of claim 1 wherein said implanting step is carried out at an energy of from about 0.3 KV to about 50 KV.

7. The method of claim 6 wherein said implanting step is carried out at an energy of from about 0.5 KV to about 20 KV.

8. The method of claim 1 wherein said dopant is implanted at a dosage of from about $1\times10^{14}/cm^2$ to about $1\times10^{16}/cm^2$.

9. The method of claim 8 wherein said dopant dosage is from about $3\times10^{14}/cm^2$ to about $5\times10^5/cm^2$.

10. The method of claim 1 wherein said dopant is implanted to a depth of from about 50 Å to about 1000 Å.

11. The method of claim 10 wherein said dopant is implanted to a depth of from about 100 Å to about 400 Å.

12. The method of claim 1 wherein said metal layer is formed by a deposition process.

13. The method of claim 12 wherein said deposition process is selected from the group consisting of chemical vapor deposition (CVD), plasma-assisted CVD, sputtering, plating, evaporation, and chemical solution deposition.

14. The method of claim 13 wherein said deposition process is sputtering.

15. The method of claim 1 wherein said metal layer is comprised of Ni, Ti, W, Co and combinations and alloys thereof.

16. The method of claim 15 wherein said metal layer is comprised of Co.

17. The method of claim 1 wherein said metal layer is formed over at least a portion of said doped region.

18. The method of claim 1 wherein said metal layer is formed in close proximity to said doped region.

19. The method of claim 1 wherein said heating step is carried out using a rapid thermal annealing (RTA) process.

20. The method of claim 19 wherein said RTA process includes laser annealing, microwave annealing or chamber annealing.

21. The method of claim 19 wherein said RTA process is carried out by microwave annealing.

22. The method of claim 20 wherein said RTA process is carried out at a temperature of about 850° C. or above and for a time of about 60 seconds or less.

23. The method of claim 22 wherein said RTA process is carried out at a temperature of from about 900° C. to about 1050° C. for a time period of from about 1 second to about 10 seconds.

24. The method of claim 1 further comprising removing any residual metal layer not converted by heating step (c).

25. The method of claim 24 wherein said residual metal layer is removed by a wet chemical etch process.

26. The method of claim 1 further comprising a second activating annealing step which follows step (c).

27. The method of claim 1 further comprising forming an optional capping layer on said metal layer prior to step (c).

28. The method of claim 27, further comprising removing said optional capping layer after conducting step (c).

* * * * *